(12) United States Patent
Suard et al.

(10) Patent No.: US 11,275,874 B2
(45) Date of Patent: Mar. 15, 2022

(54) METHOD FOR CONSTRUCTING A 3D DIGITAL MODEL FROM A 2D PLAN

(71) Applicant: COMMISSARIAT A L'ENERGIE ATOMIQUE ET AUX ENERGIES ALTERNATIVES, Paris (FR)

(72) Inventors: Frédéric Suard, Jacob Bellecombette (FR); Lucile Gimenez, Vincennes (FR); Sylvain Robert, Palaiseau (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 328 days.

(21) Appl. No.: 16/464,226

(22) PCT Filed: Dec. 1, 2017

(86) PCT No.: PCT/EP2017/081263
§ 371 (c)(1),
(2) Date: May 24, 2019

(87) PCT Pub. No.: WO2018/104183
PCT Pub. Date: Jun. 14, 2018

(65) Prior Publication Data
US 2019/0392087 A1    Dec. 26, 2019

(30) Foreign Application Priority Data

Dec. 5, 2016 (FR) ..................................... 1661912

(51) Int. Cl.
*G06F 30/13* (2020.01)
*G06F 3/04847* (2022.01)
*G06T 17/00* (2006.01)

(52) U.S. Cl.
CPC .......... *G06F 30/13* (2020.01); *G06F 3/04847* (2013.01); *G06T 17/00* (2013.01); *G06T 2210/04* (2013.01)

(58) Field of Classification Search
CPC ..................................................... G06F 30/13
See application file for complete search history.

(56) References Cited

U.S. PATENT DOCUMENTS 5,844,563 A * 12/1998 Harada .................. G06T 17/10
345/420
2006/0019679 A1 * 1/2006 Rappaport ............ H04W 64/00
455/456.5

(Continued)

OTHER PUBLICATIONS

Gimenez, et al., "Automatic reconstruction of 3D building models from scanned 2D floor plans", Automation in Construction, vol. 63, pp. 48-56, Dec. 23, 2015.

(Continued)

*Primary Examiner* — Ryan F Pitaro
(74) *Attorney, Agent, or Firm* — BakerHostetler

(57) ABSTRACT

A method, implemented by a computer, for constructing a 3D digital model of a building from a 2D plan of the building, the building having a geometry defined by at least one geometric parameter, the method comprising a plurality of steps, at least one of the steps requiring an input of at least one internal parameter, the method being wherein it comprises a step of selecting a set of parameter values without human intervention.

13 Claims, 3 Drawing Sheets

(56) References Cited

U.S. PATENT DOCUMENTS

| | | | | |
|---|---|---|---|---|
| 2008/0174598 A1* | 7/2008 | Risenhoover | G06T 15/00 | 345/419 |
| 2008/0275586 A1* | 11/2008 | Ko | G05B 23/0221 | 700/110 |
| 2009/0083075 A1* | 3/2009 | Henschke | G16H 30/20 | 705/3 |
| 2010/0057416 A1* | 3/2010 | Peterman | G06F 30/13 | 703/6 |
| 2011/0032373 A1* | 2/2011 | Forutanpour | G11B 27/34 | 348/222.1 |
| 2012/0173209 A1* | 7/2012 | Krebs | G06F 30/13 | 703/1 |
| 2013/0132041 A1* | 5/2013 | Sigaty | G06T 15/005 | 703/1 |
| 2015/0269785 A1* | 9/2015 | Bell | G06T 15/20 | 345/427 |
| 2016/0048612 A1* | 2/2016 | Simon | G06F 30/13 | 703/1 |
| 2018/0085927 A1* | 3/2018 | Kapoor | A47L 11/24 | |
| 2018/0121571 A1* | 5/2018 | Tiwari | G08B 27/005 | |
| 2018/0300433 A1* | 10/2018 | Maxam | G06F 30/13 | |
| 2019/0026956 A1* | 1/2019 | Gausebeck | H04N 13/10 | |
| 2019/0266293 A1* | 8/2019 | Ishida | G06F 30/00 | |
| 2020/0151923 A1* | 5/2020 | Bergin | G06T 19/20 | |
| 2021/0012048 A1* | 1/2021 | De Keyser | G06F 30/13 | |
| 2021/0056751 A1* | 2/2021 | Zhao | G06K 9/3233 | |

OTHER PUBLICATIONS

Okorn, et al., "Toward Automated Modeling of Floor Plans", Proceedings of the 5th Symposium on 3D Data Processing, May 17, 2010.

\* cited by examiner

METHOD FOR CONSTRUCTING A 3D DIGITAL MODEL FROM A 2D PLAN

CROSS-REFERENCE TO RELATED APPLICATIONS

This application is a National Stage of International patent application PCT/EP2017/081263, filed on Dec. 1, 2017, which claims priority to foreign French patent application No. FR 1661912, filed on Dec. 5, 2016, the disclosures of which are incorporated by reference in their entirety.

FIELD OF THE INVENTION

The invention lies in the field of the digital modeling of a building and relates to a method, a device and a computer program product for constructing a 3D digital model from one or more 2D plan images.

BACKGROUND

In the building world, there are methods for constructing a 3D digital model from a 2D plan. From an existing plan in image shape (for example a scanned paper plan, an image of an evacuation plan or a graphic model by an architect), it is possible to construct a digital model of the building (also known by the abbreviation BIM, the acronym for Building Information Model). This model makes it possible to define the geometry of the envelope of the building. In other words, the 3D digital model makes it possible to visualize all of a building in three dimensions. It is also possible to add modifications to it if necessary, particularly in the new building design phase. It brings together all of the data necessary, for example, to the construction of the work, that is to say the technical components of the building, but the digital model can also contain data essential to its operation, for example in terms of thermal management of the building. This digital model is therefore a digital file which combines all of the technical information of the components of a building, such as the thickness of the walls, the dimensions of the windows or of the beams, possibly the technical characteristics of the thermal equipment, the quality of the insulators and their impact on energy consumption.

A user wishing to obtain such a digital model must therefore be able to interpret the image supplied, that is to say a 2D plan, to add additional information and semantics and characterize the properties of the reconstructed elements (door, window, thickness of a wall, etc.).

There are methods for the 3D extrusion of plans obtained from computer aided design (also known by its abbreviation CAD). In these methods, the input data are derived from data in the CAD format, that is to say it involves images that have been vectorized and stored in a format which contains vectors, and not pixels. Moreover, no other information, for example on the materials, is contained in these data.

The methods for constructing 3D digital models from existing 2D plans are based on algorithms applied at different steps of the reconstruction method. However, these algorithms require the input of parameters dependent on concepts from the image processing or shape recognition field, that is to say outside of the area of competence of the assumed user, which is generally architecture, thermal study, or construction. The user may therefore be induced to choose bad parameters or parameters ill-suited to the particular case that is being processed in the construction of the digital model. The result thereof is an inappropriate or incomplete 3D digital model. One technical problem to be resolved therefore consists in proposing a method for constructing a 3D digital model from a 2D plan without the user having to choose the values for multiple parameters, while ensuring a 3D digital model of quality, corresponding to the components of the building.

SUMMARY OF THE INVENTION

The invention aims to overcome all or part of the problems cited above by proposing a method for constructing a 3D digital model from one or more 2D plan images wherein the choice of the parameters is made automatically, making it possible to involve the user little or not at all. The result thereof is a gain in performance and in time, ease and robustness in the use of the method because the user does not need to understand the impact of all of the parameters applied which do not a priori fall within his or her initial skills.

To this end, the subject of the invention is a method, implemented by computer, for constructing a 3D digital model of a building from a 2D plan of the building, the building having a geometry defined by at least one geometrical parameter, the method comprising a plurality of steps, at least one of said steps requiring an input of at least one internal parameter, the method being characterized in that it comprises a step of selecting a set of values of the parameters without human intervention.

Advantageously, the method according to the invention further comprises a step of defining a performance indicator intended to evaluate the performance of a set of parameter values selected without human intervention, wherein the step of selecting a set of values of the parameters without human intervention comprises the steps of computing the performance indicator associated with each set of parameter values, of comparing the computed performance indicators, and of selecting the set of parameter values giving the highest performance indicator out of all the computed performance indicators.

According to an embodiment of the invention, the method further comprises a step of proposing correction of the values of the selected parameters without human intervention, allowing a user to choose at least one value of at least one parameter, a step of saving the at least one value chosen by the user, so as to construct a history of the choices of the user, the step of selecting the set of the values of the parameters without human intervention being done by taking account of the history of the choices of the user.

According to another embodiment of the invention, the method further comprises a step of saving the set of the parameter values selected without human intervention, so as to construct a history of the parameter values, the step of selecting the set of the parameter values without human intervention being done by taking account of the history of the parameter values.

According to another embodiment of the invention, the 2D plan comprising graphic elements, the plurality of steps of the method comprises a step of extracting the graphic elements from the 2D plan, a step of identifying the graphic elements so as to define the geometry of the building, a step of generating the 3D digital model.

According to another embodiment of the invention, the method comprises, after the step of generating the 3D digital model, a step of exporting the 3D digital model in a previously defined format.

According to another embodiment, the step of generating the 3D digital model comprises the following steps of defining external elements corresponding to the external geometry of the building from the graphic elements, of defining internal elements corresponding to the graphic elements distinct from the external elements, of identifying zones of the building formed by a set of external and/or internal elements forming a closed polygon and whose surface area is greater than a threshold value.

According to another embodiment, the 2D plan comprising text elements, the step of extracting the graphic elements is preceded by a step of extracting the text elements.

According to another embodiment, the method according to the invention comprises, beforehand, a step of digitizing the 2D plan to obtain a digitized image.

According to another embodiment of the invention, the method comprises, prior to the step of selecting the set of the parameter values without human intervention, a step of determining the possible values for each parameter from a grid of values for each parameter.

According to another embodiment of the invention, the method comprises, prior to the step of selecting the set of the parameter values without human intervention, a step of determining the possible values for each parameter by a meta-heuristic approach.

According to another embodiment of the invention, the method comprises, prior to the step of selecting the set of the parameter values without human intervention, a step of determining the possible values for each parameter by a meta-model approach.

The invention relates also to a device for constructing a 3D digital model from a 2D plan, the device comprising means for implementing the steps of such a method.

The invention relates also to a computer program product, said computer program comprising code instructions making it possible to perform the steps of the construction method, when said program is run on a computer.

BRIEF DESCRIPTION OF THE DRAWINGS

The invention will be better understood and other advantages will become apparent on reading the detailed description of an embodiment given by way of example, the description being illustrated by the attached drawing in which.

DETAILED DESCRIPTION

In the interests of clarity, the same elements will bear the same references in the different figures.

In the description, the invention is described with the example of a 2D plan representing a floor of a building. This 2D plan can be, for example, a scanned paper plan, an image of an evacuation plan or a graphic model by an architect. However, the invention is applicable likewise to multiple 2D plans, each representing a floor of a building with multiple floors, the 3D digital model of the building then being obtained by the assembly or concatenation of the 3D digital models obtained. Likewise, similarly, the invention applies also to a very large floor represented on several 2D plans, in which case the images of a floor on several files can be concatenated before the construction of the 3D digital model.

Figure 1:
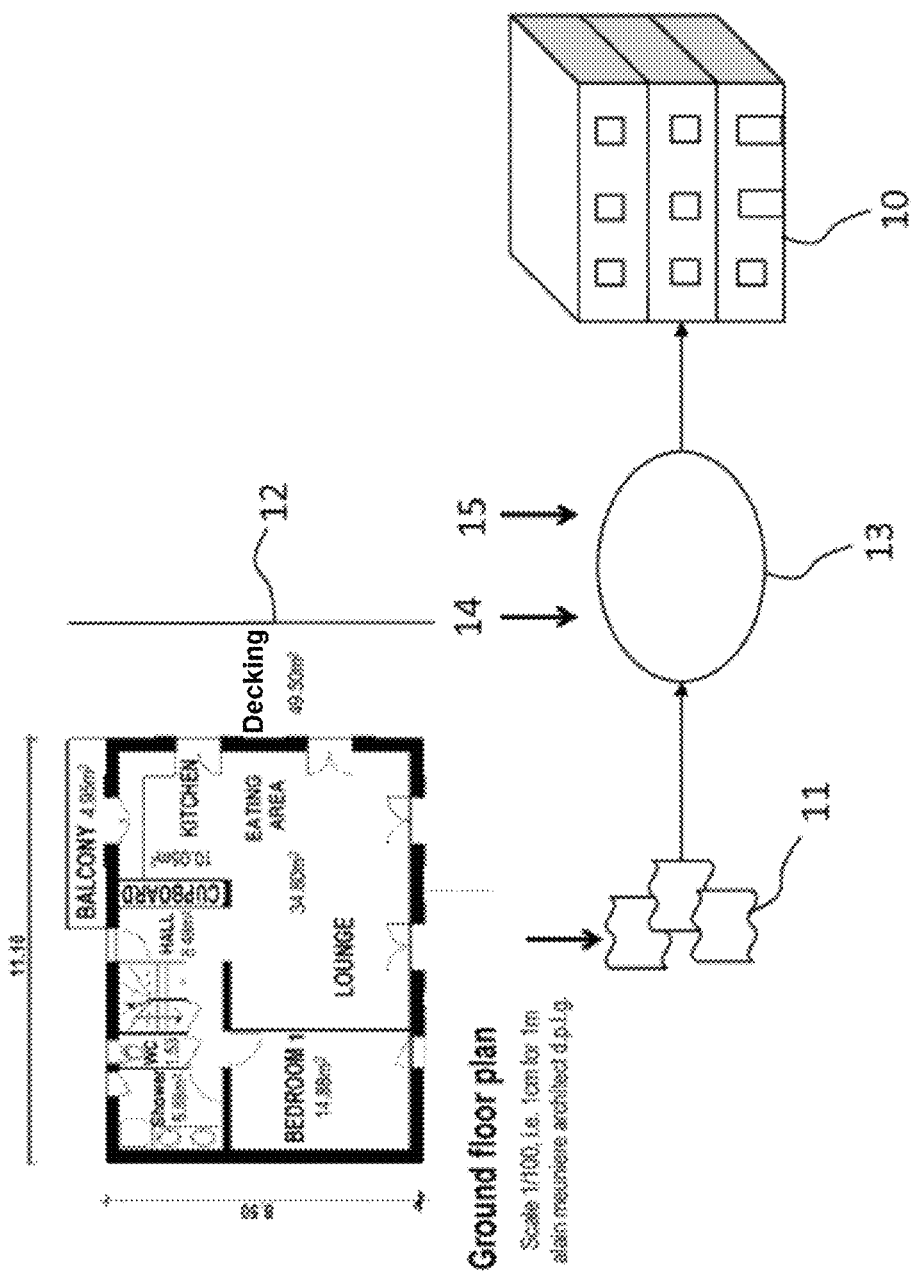
FIG. 1 schematically represents the principle of the method for constructing a 3D digital model of a building from a 2D plan of the building according to the invention, FIG. 2 schematically represents the steps of an embodiment of a method for constructing a 3D digital model of a building from a 2D plan of the building according to the invention, FIG. 3 schematically represents the steps of another embodiment of a method for constructing a 3D digital model of a building from a 2D plan of the building with selection of a set of values of the parameters without human intervention according to the invention.

FIG. 1 schematically represents the principle of the method for constructing a 3D digital model 10 of a building from a 2D plan 11 of the building according to the invention. The method according to the invention makes it possible to construct, from an existing plan 11, 12 in image form, a digital model 10 of the building. This model is called BIM, the acronym for Building Information Model. This digital model 10 makes it possible to define the geometry of the envelope of the building. The particular feature of such a construction method lies in the capacity to interpret the image 11, 12 supplied to add additional information (semantics) and identify the type of the element present in the plan. In addition to identification, the method according to the invention makes it possible to validate the consistency of the reconstruction by ensuring that the overall integrity from the viewpoint of the envelope of the building is guaranteed.

The method, implemented by computer, for constructing the 3D digital model 10 of the building from one or more 2D plans 11, 12 of the building comprises a plurality of steps 13. At least one of said steps requires an input of at least one internal parameter (in particular parameters internal to the algorithms used). Moreover, the building has a geometry defined by at least one geometrical parameter (for example thickness of the walls, height of the doors, height of the windows, etc.). As explained previously, the difficulty in implementing such a method lies in particular in the choice of the parameters intrinsic to the algorithms implemented. According to the invention, the construction method comprises a step 102 of selecting a set of values of the parameters without human intervention. The method according to the invention therefore makes it possible to progress efficiently by reducing the errors or lacunae of reconstruction and also the time needed to produce a digital model because it can propose suitable parameter values, without the user having specific skills in the field of image processing. The method can comprise a step of displaying the 3D digital model on a screen, for example a computer screen, to make it possible to visualize the building in three dimensions, for example for design aid purposes, and/or to make it possible to navigate virtually within. By virtue of the method according to the invention, it is also possible to make modifications to the model. For example, a future owner can, from the 2D plans supplied by the architect, visualize his or her future home in 3D, navigate within the model and possibly request a modification, for example on the positioning of a wall or of a window.

Figure 2:
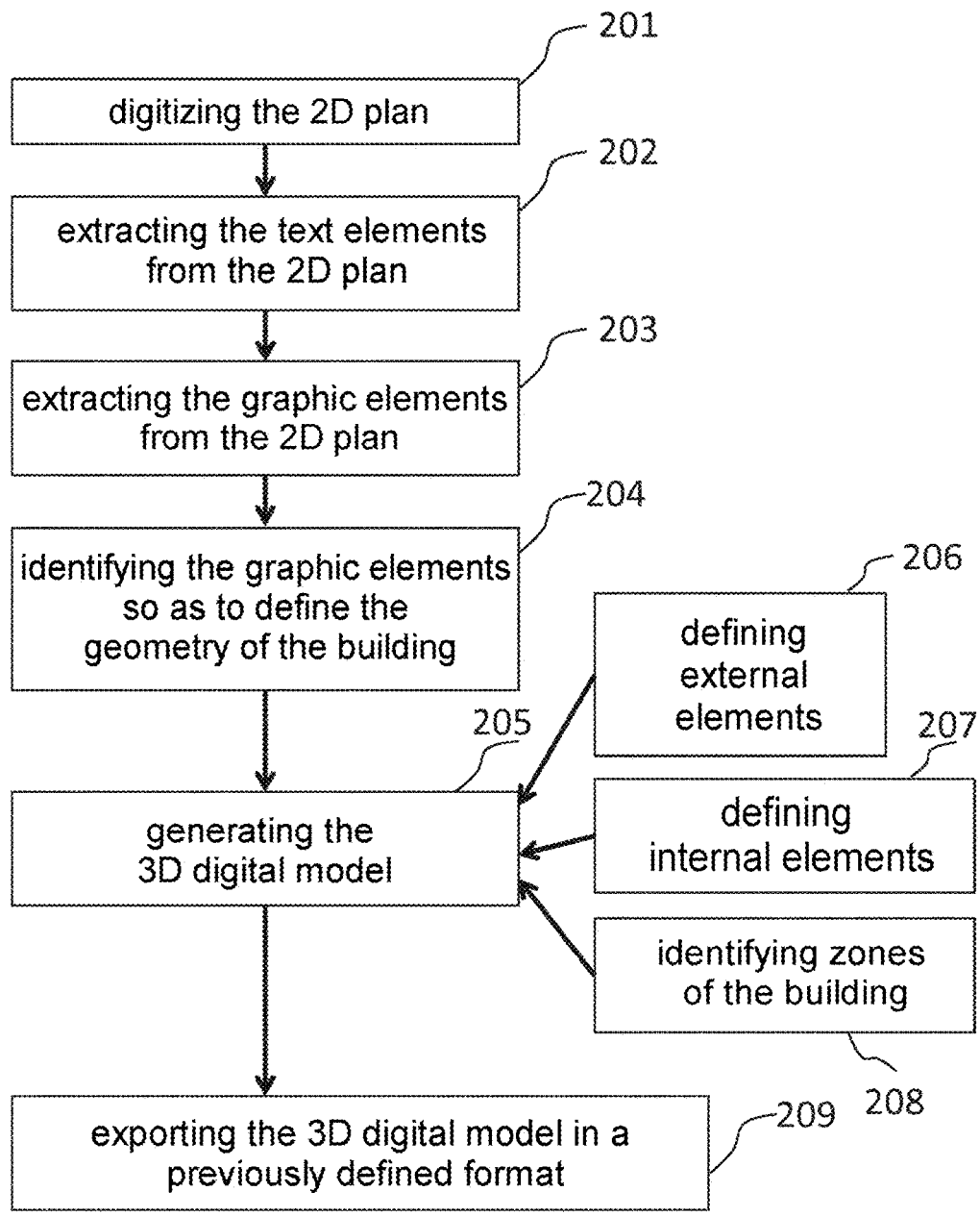

FIG. 2 schematically represents the steps of an embodiment of a method for constructing a 3D digital model of a building from a 2D plan of the building according to the invention. The 2D plan comprising graphic elements, the plurality of steps comprises a step 203 of extracting the graphic elements from the 2D plan, a step 204 of identifying the graphic elements so as to define the geometry of the building, and a step 205 of generating the 3D digital model.

After the step 205 of generating the 3D digital model, the method according to the invention can comprise a step 209 of exporting the 3D digital model in a previously defined format. This step 209, advantageously but without being mandatory, consists in generating a model that can be used by other tools. It in fact involves describing all of the elements of the building in a format compatible with other software, for example the IFC (the acronym for Industry Foundation Classes) format. This format makes it possible to store in a text file all of the elements by observing a hierarchy specific to the format that observes the breakdown of the building by floor, room, element (wall/opening). The basic description is geometrical, the information extracted during the method is therefore sufficient. It is however possible to extend the description of the elements by adding specific properties such as the type of material, the date of construction, etc.

According to an embodiment of the method, the step 205 of generating the 3D digital model comprises a step 206 of defining external elements corresponding to the external geometry of the building from the graphic elements, a step 207 of defining internal elements corresponding to the graphic elements distinct from the external elements, and a step 208 of identifying zones of the building formed by a set of external and/or internal elements forming a closed polygon and whose surface area is greater than a threshold value.

Advantageously, if the 2D plan comprises text elements, the step 203 of extracting the graphic elements is preceded by a step 202 of extracting the text elements.

If necessary, the method according to the invention can comprise, beforehand, a step 201 of digitizing the 2D plan to obtain a digitized image.

Thus, from the image supplied initially, a preprocessing is applied to clean the image of the spot defects linked to the digitization and to perform a conversion of the image into black and white. This bit-mapping involves applying a threshold to the value of the initial image to define the final image.

An image point P is defined by its coordinates, and the value of the pixel of the bit-mapped image corresponding to the location in the image:

$$P = \begin{cases} (x, y, v) \\ v = I_b(x, y) \end{cases}$$

with v=1 if the value of the corresponding pixel in the initial image is greater than a threshold, 0 otherwise.

From the bit-mapped image, the step 202 consists in isolating the text elements of the image, in order to retain only the graphic elements. For that, an automatic text recognition tool (of OCR type, OCR being the acronym for Optical Character Recognition) is applied to all of the image in order to isolate the zones of the image containing a text field. A text element extracted from an image is thus defined by an encompassing box and a text field:

$$t = \{P_1, P_2, \text{string}\}$$

It should be noted that the encompassing rectangle is defined here by the two points P1 and P2 and its diagonal.

The other elements to be extracted from the image are the graphic elements, which will therefore be the object of the subsequent recognition for the elements of the building. In the image, it is necessary to identify each geometrical primitive defined by a set of points:

$$e = \{P_i\}_{i=2 \ldots n}$$

These points can correspond to a segment, a circular arc or any other predefined form. In the case of the search for circular arcs or segments, the Hough method can be applied, the principle of which consists in retaining the axes of the image accumulating a large number of points. This method thus makes it possible to identify the segments contained in the image, and the circular arcs.

In order to limit the number of elements recognized in the initial image, a filtering of the geometrical primitives is performed. This filtering makes it possible to eliminate the segments whose length is less than a minimum value. This value is defined as a function of the minimum possible size of a wall.

The purpose of the method relates to the modeling of the envelope of the building, that is to say the walls and the openings. A building is made up of sets of geometrical primitives, of text elements and of elementary forms (walls Bk=Bw, openings Bk=Bo):

$$B = \{\{e_i\}_{i=2 \ldots n}, \{t_j\}_{j=0 \ldots p}, \{B_k\}_{k=0 \ldots q}\}$$

with Bw a wall defined by a set of segments of similar orientation, of approximate length lying within an interval [Lmin–Lmax], and for which the distance separating d(e1, e2) lies within an interval of values [Emin–Emax] established from the possible thicknesses of the walls:

$$B_w = \begin{cases} \{e_1, e_2\} \\ e_{1_{shape}} = e_{2_{shape}} = \text{segment} \\ e_1 \mathbin{//} e_2 \\ E_{min} < d(e_1, e_2) < E_{max} \\ L_{min} < l(e_1) < L_{max} \\ L_{min} < l(e_2) < L_{max} \end{cases}$$

and Bo, an opening defined by a set of parallel segments, possibly having, in the vicinity, discriminating signs such as an arc, and such that Bo is included in an element Bw.

$$B_o = \begin{cases} \{e_1, e_2, B_w, (e_3)\} \\ e_{1_{shape}} = e_{2_{shape}} = \text{segment} \\ e_{3_{shape}} = \text{arc} \\ e_1 \subset B_w \\ e_2 \subset B_w \\ |d(e_1, e_2) - d(B_{w_{o1}}, B_{w_{o2}})| < \epsilon \end{cases}$$

The notion of inclusion of an opening in a wall makes it possible to generalize the identification of an opening from a discontinuity in a wall according to a predefined interval relating to the possible width of the openings.

At this stage of the method, the building is defined by sets of walls and of openings which will subsequently be modified to correct the topology, infer missing walls, make the thicknesses uniform, etc.

The overall reconstruction of the model is founded on methods for aggregating elementary elements identified in the image. The method is defined as a number of successive steps as mentioned previously: a step 206 of defining external elements corresponding to the external geometry of the building from the graphic elements, a step 207 of defining internal elements corresponding to the graphic elements distinct from the external elements, and a step 208 of identifying zones of the building formed by a set of external and/or internal elements forming a closed polygon and whose surface area is greater than a threshold value, and possibly an exporting step 209.

In order to guarantee the architectural integrity, in the step 206, the aim is to extract a closed shape, that is to say identify, from the sets of elements, a subset of elements connected two-by-two. This shape thus makes it possible to define the overall footprint of the building.

At this stage, it is necessary to introduce the concept of topology, that is to say the geometrical locations corresponding to intersections between the elements. The topology makes it possible in particular to guarantee that the shape is indeed connected and that there are therefore no empty gaps between walls, which could introduce a bias in the use of the model generated according to the application. For each intersection, a topological point is created:

$$P_t = (B_{w1}, B_{w2}, (x,y))$$

The external shape is formalized as follows: it is defined by a set of walls, linked two-by-two, and such that the shape is connected.

$$F_B = \begin{cases} \{\{B_{wO_i}\}_{i=3...n}, \{B_{o_j}\}_{j=1...p}, \{P_{t_k}\}_{k=3...q}\} \\ \forall B_0 \in \{B_{o_j}\}_{j=1...p}, B_{o B_w} \in \{B_{wO_i}\}_{i=3...n} \\ \forall B_w \in \{B_{wO_i}\}_{i=3...n}, \exists! (P_{t1}, P_{t2}) \in \{P_{t_k}\}_{k=3...q} \mid B_w \subset P_{t1} \text{ and } B_w \subset P_{t2} \end{cases}$$

During this step, modifications can be made to the elements in order to identify missing walls, make the thicknesses of walls uniform in one and the same extension.

A simplification of the elements is also applied, in order to merge walls into just one, in order to limit the number of elements. This merging is for example performed on contiguous walls, in extension, whose geometrical properties are similar (thickness, orientation). This simplification also makes it possible to eliminate inconsistent walls, such as overlapping walls or totally included walls.

The elements not belonging to the external shape are then analyzed and are therefore categorized as internal elements. The difference lies essentially in the topology associated with the internal elements since the number of links is not dependent on the same constraints. It is for example possible to retain an internal wall having only a topological connection with another element of the building. Modifications are also made to these elements, in order to simplify their number, in particular by eliminating totally included elements, or by merging elements in extension.

A final detection is applied (step 208) to identify the spaces of the building, that is to say the closed zones in the plan or else spaces that are uniform from a thermal point of view. A space is a zone of the building formed by a set of walls and openings forming a closed polygon, whose total surface area As is greater than a threshold value, centered on an element of the plan describing the space, for example a text field deriving from the initial recognition:

$$S = \begin{cases} \{P_{t_k}\}_{k=3...n}, t_1 \\ t_1 \subset S \\ A_S > A_{min} \end{cases}$$

The space is thus delimited by a set of walls and of openings, internal or external, forming a connected set, that is to say a set of linked elements forming a closed envelope. In order to limit the number of possible spaces, no overlap between two spaces is possible.

The algorithms used in the steps described above involve a certain number of parameters applied at different stages of the reconstruction, from the preprocessing steps through to aggregation. Now, as already explained, the user may be induced to choose bad parameters or parameters ill-suited to the particular case that he or she is processing in the reconstruction. The result thereof is an inappropriate 3D digital model.

Figure 3:
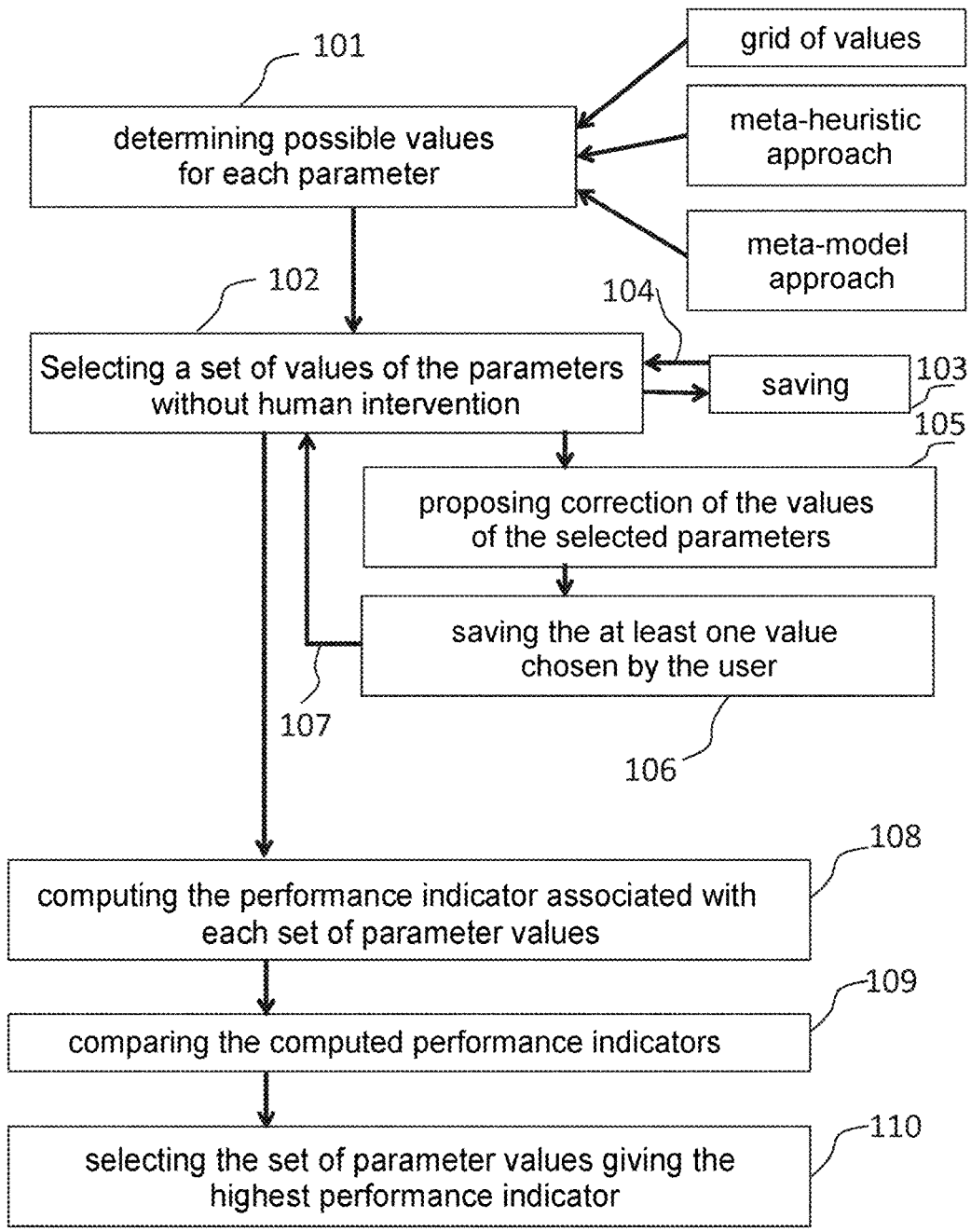

FIG. 3 schematically represents the steps of another embodiment of a method for constructing a 3D digital model of a building from a 2D plan of the building with selection of a set of values of the parameters without human intervention according to the invention.

Among the parameters involved in the method for constructing the digital model, parameters that can be cited are those internal to the algorithms, such as, among others, the threshold of binarization of the original image, the type of function used for the detection of the outlines, the constraint on the orientation of the search for segments, the type of representation of walls (uniform walls black or white, representation by shading), the density of the zone of the image for the validation of the walls, etc. The Hough method involves a minimum length and a maximum length of the segments, and can tolerate a discontinuity in the segments. It is also possible to cite the parameters linked to the geometry, such as, among others, the interval in terms of pixels of the minimum thickness and maximum thickness of the walls, the number of possible thicknesses for the representation of the walls, the spatial resolution, the minimum width of an opening (door, window), the minimum area of a space, etc.

Each parameter can take a value from a predefined set. For example, the binarization threshold varies from 0 to 255, i.e. the possible number of gray levels in an image or else rounded to comparable values by the user. Similarly, the thickness of the walls can take different possible values. The result thereof is a multitude of possible combinations. The combination of the parameters also has importance, since some parameters can be interdependent. It is therefore necessary to be able to evaluate several parameters simultaneously.

It emerges that the choice of the values of the parameters is complex. These parameters depend on the recognition algorithms and on the reconstruction rules which do not systematically correspond to the profession of the user (architect, thermal design office, etc.). The variety of the parameters involved can therefore be a limiting factor if the user does not have simple means available for understanding or choosing the values of these parameters. The general idea of the invention lies in the fact that the construction method comprises a step 102 of selecting a set of values of the parameters without human intervention.

According to an embodiment of the invention, the method further comprises a step of defining a performance indicator intended to evaluate the performance of a set of parameter values selected without human intervention, wherein the step 102 of selecting a set of values of the parameters without human intervention comprises a step 108 of computing the performance indicator associated with each set of parameter values, a step 109 of comparing the computed performance indicators, and a step 110 of selecting the set of parameter values giving the highest performance indicator out of all the computed performance indicators. The performance is closely linked to the quality of the reconstruction.

Whatever the approach, in determining the values of the parameters, an automated approach means being able to evaluate the performance of a selected set of values, by computation of the performance indicator. In the context of the construction or renovation of a building, there is no reference to which to compare, that is to say a ground truth which reliably accounts for the correct reconstruction of the digital model. In the present case, a good reconstruction of the digital model is defined by the rate of reconstruction of the elements of the building recognized automatically. An evaluation of the performance can be established blind by accounting for the number of elements reconstructed for each set of parameters. The indicator can therefore be proportional to the different values, for example the number of walls detected, the number of openings detected, the total lengths of the reconstructed walls, the total length of the reconstructed openings, the surface area of the reconstructed building, the number of topological connections between the elements of the building.

The first two indications relating to the number of walls and of openings detected can however lead to errors of construction of the digital model, particularly in the case of false detections, or else when the walls are identified partially by one-off and discontinuous segments. Thus, the linear length of the elements is a more robust criterion, because this evaluation limits the number of noisy elements containing little information. Furthermore, an implicit criterion for evaluating the correct reconstruction lies in the structural consistency of the envelope of the building. A single wall replacing several elements will therefore be more relevant for the quality of the representation because it presents less risk of digital error during the subsequent manipulations. In order to confirm the reconstructed elements, it may be advantageous to evaluate the total surface area defined by the estimated model. This value can, for its part, be estimated simply by the overall dimensions of the building, and makes it possible in particular to set an upper limit on the selection of the parameters, in order to not add false elements. Another criterion relating to the structural consistency is the number of topological connections, that is to say the number of relationships between the elements of the building. A topological connection in fact ensures that there is an intersection between the elements which are not unconnected, which would be counter to the reality.

The evaluation of the performance can be founded on one or more criteria. Advantageously, the performance indicator is based on the total length of all the elements and/or the number of connections so as to guarantee a good coherent construction of the digital model. The performance indicator can for example be based on a linear combination of the total length of all the elements and of the number of connections. The optimal parameter values must therefore maximize this performance indicator, but however by observing a threshold value on the reconstructed surface area. The length of the elements can be combined linearly, or else by including a weighting, in order to prioritize, for example, a family of elements that is more relevant for the reconstruction, in particular the walls. According to the parameters considered, the highest performance indicator should be understood to be an indicator that is best suited to the function of the geometrical parameter considered.

According to another embodiment, the method can comprise a step 105 of proposing correction of the values of the parameters selected without human intervention, allowing a user to choose at least one value of at least one parameter, a step 106 of saving the at least one value chosen by the user, so as to construct a history of the choices of the user, and the step 102 of selecting the set of the parameter values without human intervention is done by taking account of the history of the choices of the user (step 107).

This embodiment can be combined with the embodiment involving the performance indicator, but it can also be taken in isolation.

According to another embodiment, the method according to the invention can comprise a step 103 of saving the set of the parameter values selected without human intervention, so as to construct a history of the parameter values, and the step 102 of selecting the set of the parameter values without human intervention is done by taking account of the history of the parameter values (step 104).

This embodiment can be combined with the embodiment involving the performance indicator and/or the correction proposal, but it can also be taken in isolation.

Prior to the step 102 of selecting the set of the parameter values without human intervention, the method according to the invention can comprise a step 101 of determining the possible values for each parameter from a grid of values for each parameter. This type of determination is the most intuitive and the easiest to implement. The raw search makes it possible to scan a grid of values for each parameter. The benefit is being able to respond to all possible forms of problems, but the solving time is proportional to the number of parameters and of possible values for each parameter. If the time needed for an iteration (that is to say the execution of the algorithm for a given set of parameters) is great, then the solving can become unfeasible within a reasonable time. The solution consists in reducing the number of parameters, or limiting the number of possible values to the detriment of the accuracy obtained for the result.

Alternatively, prior to the step 102 of selecting the set of the parameter values without human intervention, the method according to the invention can comprise a step 101 of determining possible values for each parameter by a meta-heuristic approach. This type of determination consists in navigating within a space of the parameters during several iterations, with different parameter value possibilities. By analogy with genetics, an evolution of the parameter values based on the best sets of parameter values is possible using mutation and cross-breeding mechanisms on the sets of parameters.

Alternatively, prior to the step 102 of selecting the set of the parameter values without human intervention, the method according to the invention can comprise a step 101 of determining possible values for each parameter by a meta-model approach.

The meta-model approach is founded on the assumption that an objective function is defined according to a function or a hyperplan which can be inferred. The general principle consists in estimating the parameters of a function, for example a polynomial, which is an estimator of the cost function. The parameters are adjusted using sample points derived from the genuine cost function, here the execution of a reconstruction instance for a fixed set of parameters.

Kriging is a statistical interpolation technique that makes it possible to approximate an exact function whose digital execution is costly by an approximation model (meta-model). The meta-model is determined using a set of points deriving from the exact function according to an iterative process. The principle consists in choosing the best interpolation function for these known points, while being capable of approximating the uncertainties in order to be able to estimate the initial function over all of the space.

The resolution makes it possible to approximate a given digital model y(x) using a combination of a regression function and of a stochastic process:

$$K(x) = \mathcal{F}(x) + z(x)$$

in which K is a kriging model (i.e. meta-model) approximating the real response $K(x) \in \mathbb{R}$ for an input vector of dimension n: $x \in D \subset \mathcal{F}(x)$ the regression function and $z(x)$ the stochastic process, $D \subset \mathbb{R}^n$ represents the constraints (bounds) that apply to the variable x.

In the context of the invention, the digital model for which the behavior is to be approximated is the value $y(x) \in \mathbb{R}$ that makes it possible to quantify the quality of reconstruction of the digital model as a function of different parameters of the algorithm. The quality of reconstruction (or performance) can, in our case, be defined as a linear combination of several characteristic indicators of the reconstructed model: total length of the walls, degree of connectivity between these walls, number of openings identified.

If y(x) is used to denote the performance indicator obtained upon the application of the algorithm according to a vector of the parameters of the algorithm $x \in D \subset \mathbb{R}^n$ (binarization threshold, maximum thickness of a wall, etc.) and $D \subset \mathbb{R}^n$ is the space of the physically possible solutions, the aim is therefore to approximate the indicator y(x) using the kriging model K(x) such that:

$$K(x) = \mathcal{F}(x) + z(x)$$

In the context of the prototyping of the invention, the regression function $\mathcal{F}(x)$ is a polynomial regression model consisting of a linear combination of p polynomial functions f(x) combining the input variables:

$$\mathcal{F}(x) = \sum_{i=1}^{p} \beta_i f_i(x)$$

in which $(\beta_1, \ldots, \beta_p) \in \mathbb{R}^p$ are the regression coefficients.

The stochastic part, for its part, is a centered Gaussian process characterized by its covariance function $cov(Z(x), Z(u)) = \sigma^{-2} R(x,u)$ in which $\sigma^{-2}$ represents the variance of Z and R(x,u) represents the correlation function. This correlation function is an exponential correlation function.

Based on these hypotheses, the principle of the kriging algorithm is to determine a set of kriging models K that are valid (i.e. that observe a predefined error criterion), then to identify, within this set, the kriging model that gives the best result, and finally, to optimize the input parameters to minimize the error. This process is repeated until a predefined convergence criterion is reached (threshold on the model estimation error, maximum number of iterations). More specifically, the algorithm comprises the following steps:

1. Selection, within the space of the solutions, of a set r of samples of the parameters sought $(x_1, \ldots, x_r)$ in which $x_i \in D \subset \mathbb{R}^n$. For each of these samples, execution of the reconstruction algorithm and generation of a vector $(y_1, \ldots, y_r)$ of construction quality values.
2. Creation and calibration of a set of kriging models $K_i$, i=1 r, each model $K_i$, i=1 r being calibrated using the set of the samples except for $x_i$
3. Verification of the validity of the kriging models using a cross validation: each model is tested on the basis of the sample $x_i$ and the validity criterion is based on the observed error.
    In the case where one (or several) of the kriging models is (are) invalid, the sample $(x_1, \ldots, x_r)$ is adjusted and the algorithm is executed once again on the modified sample elements. The step 3 is then reiterated until a valid sample is obtained.
4. Search within the sample for the most powerful kriging model and, on the basis thereof, search the values of the parameters $x_{min}$ that minimize the error (gradient algorithm).

In the case where the convergence criterion (criterion based on the error) is not reached, the sample is extended and the algorithm is relaunched.

Once the kriging model is obtained, it will be possible to identify the parameters of the reconstruction algorithm that make it possible to obtain the best construction quality. The resolution of the optimal value of the parameters of the algorithm will be performed by applying an optimization method seeking to optimize the quality criterion, in this case maximize the performance. The benefit of the kriging is revealed here by the form of its formulation, the latter being convex, the resolution being accessible through conventional and rapid methods, such as gradient descent.

The resolution of the problem is therefore based on the estimation of the function by meta-model and the navigation in the space of the parameters.

This last point is necessary for generating new observations, in an active learning approach, in order to be able to best explore the space of the parameters and update the estimator of the cost function. To do this, N points in the space are first of all chosen and the value of the associated indicator is computed. As long as the convergence is unfinished, the meta-model is estimated and points are added and an associated convergence indicator is computed. The convergence criteria can be, for example, a maximum number of iterations or a threshold on the value of the performance indicator, the stability. The number of iterations is a criterion that is simple to implement which can also be defined from a maximum computation time. Here, the performance value, that is to say the quantity of information reconstructed, is estimated as a function of the number of elements identified and reconstructed. It is however difficult to establish a maximum reference value since the ground truth is unknown. The stability remains an accessible criterion, but the concept of plateau still remains difficult to define. The ideal solution is therefore to combine the maximum value of the indicator with a threshold on the number of iterations, that is sufficiently high to allow a satisfactory solution to be proposed, but without penalizing the construction time.

Another difficult point in this procedure lies in the addition of points for iterating and creating a new model. Several options are offered in order to converge toward the maximum value of the objective, i.e. to explore the uncertain zones. In this particular case, it is essential to define strategies based on random sampling or smart exploration strategies using, for example, a cross validation that makes it possible to estimate the areas of highest uncertainty coupled with particular points such as the maximum or the minimum. Here, the space remains relatively restricted, and the cost function does not present any strong discontinuity. The search for the maximum value of the objective is therefore preferable.

The method for constructing the 3D digital model from a 2D plan according to the invention therefore comprises a step 101 of determining the values that all the parameters can take. This determination step can be performed by means of different approaches (rough approximation by scanning and testing of all the possible values in a grid of values, meta-heuristic approach with optimization by genetic algorithm of the set of the parameter values, meta-model approach with the approximation of the form of the cost function, also known as kriging method). It involves an automated approach for determining the values. Such a method entails being able to evaluate the performance of a set of values. For each set of values, a performance indicator is computed, the computed indicators are compared to one another and the set of values of the parameters giving the best performance indicator is selected. The method according to the invention makes it possible to automatically select the best set of values of the geometrical parameters and parameters internal to the algorithms.

Thus, a major advantage of the invention lies in the capacity to work automatically while invoking the minimum of interventions of the user. The result thereof is a time saving and enhanced ease of use because the user does not need to understand the impact of the parameters applied, which do not, a priori, fall within his or her initial skills.

Several applications can benefit from the advantages provided by the invention. For example, the invention can provide an aid to the design of a new building and to the renovation of a building. It can in particular be a support in the choice of the materials to obtain a building with optimal thermal management. Also, the invention can be applicable in the field of safety for the evacuation of persons in the event of accidents and in the management of emergency situations.

The invention relates also to a device for constructing a 3D digital model from a 2D plan, the device comprising means for implementing the steps of the method according to the invention.

The invention relates also to a computer program product, said computer program comprising code instructions making it possible to perform the steps of the construction method according to the invention when said program is run on a computer.

The person skilled in the art will consider that the present invention can be implemented from hardware and/or software elements and run on a computer, such a computer comprising means that make it possible to apply the steps of the method. The computer can be coupled to a digitizing system, a scanner, a camera. The invention can also work on a tablet equipped with a camera for acquiring the 2D image. The invention can be available as a computer program product on a computer-readable medium. The medium can be electronic, magnetic, optical, electromagnetic or be a broadcasting medium of infrared type. Such media are for example, semiconductor memories (Random Access Memory RAM, Read-Only Memory ROM), tapes, diskettes or magnetic or optical disks (Compact Disk-Read Only Memory (CD-ROM), Compact Disk-Read/Write (CD-R/W) and DVD).

The invention claimed is:

1. A method, implemented by computer, for constructing a 3D digital model of a building from a 2D plan of the building, the building having a geometry defined by at least one geometrical parameter, the method comprising a plurality of steps, at least one of said steps requiring an input of at least one internal parameter, at least two parameters amongst the at least one geometrical and/or the at least one internal parameter being interdependent, wherein the method comprises:
   a step of providing the 2D plan;
   a step of selecting a set of values of the parameters out of a plurality of sets of values of the parameters, comprising the following steps:
      computing a performance indicator corresponding to a rate of reconstruction of the at least one geometrical parameter for each set of parameter values, intended to evaluate the performance of a set of selected parameter values,
      comparing the computed performance indicators, and
      selecting the set of parameter values giving the highest performance indicator out of all the computed performance indicators; and
   a step of generating the 3D digital model.

2. The construction method of claim 1, further comprising:
   a step of proposing correction of the values of the selected parameters,
   allowing a user to choose at least one value of at least one parameter,
   a step of saving the at least one value chosen by the user, so as to construct a history of the choices of the user, and
   the step of selecting the set of the values of the parameters being done by taking into account the history of the choices of the user.

3. The construction method of claim 1, further comprising:
   a step of saving the set of selected parameter values, so as to construct a history of the parameter values,
   the step of selecting the set of the values of the parameters being done by taking account of the history of the parameter values.

4. The construction method of claim 1, the 2D plan comprising graphic elements, wherein the plurality of steps comprises, before the step of generating the 3D digital model:
   a step of extracting the graphic elements from the 2D plan,
   a step of identifying the graphic elements so as to define the geometry of the building.

5. The construction method of claim 4, comprising, after the step of generating the 3D digital model, a step of exporting the 3D digital model in a previously defined format.

6. The construction method of claim 4, wherein the step of generating the 3D digital model comprises the following steps:
   defining external elements corresponding to the external geometry of the building from the graphic elements,
   defining internal elements corresponding to the graphic elements distinct from the external elements,
   identifying zones of the building formed by a set of external and/or internal elements forming a closed polygon and whose surface area is greater than a threshold value.

7. The construction method of claim 4, the 2D plan comprising text elements, wherein the step of extracting the graphic elements is preceded by a step of extracting the text elements.

8. The construction method of claim 4, comprising, previously, a step of digitizing the 2D plan to obtain a digitized image.

9. The construction method of claim 1, comprising, prior to the step of selecting the set of the parameter values, a step of determining possible values for each parameter out of a grid of values for each parameter.

10. The construction method of claim 1, comprising, prior to the step of selecting the set of the parameter values, a step of determining possible values for each parameter by a meta-heuristic approach.

11. The construction method of claim 1, comprising, prior to the step of selecting the set of the parameter values, a step of determining possible values for each parameter by a meta-model approach.

12. A device for constructing a 3D digital model from a 2D plan, the device comprising means for implementing the steps of the method of claim 1.

13. A non-transitory computer readable medium comprising instructions making it possible to perform the steps of the construction method as claimed in claim 1, when said program is run on a computer.

* * * * *